April 21, 1970 J. M. BIELEN ET AL 3,507,426

METHOD OF DICING SEMICONDUCTOR WAFERS

Filed Feb. 23, 1968

INVENTORS
JOSEPH M. BIELEN &
GILBERT V. MORRIS
BY M. Y. Epstein
ATTORNEY

United States Patent Office 3,507,426

Patented Apr. 21, 1970

3,507,426

METHOD OF DICING SEMICONDUCTOR WAFERS

Joseph M. Bielen, McAdoo, and Gilbert V. Morris, Dallas, Pa., assignors to RCA Corporation, a corporation of Delaware Filed Feb. 23, 1968, Ser. No. 707,866
Int. Cl. B26f *3/00*
U.S. Cl. 225—2 2 Claims

ABSTRACT OF THE DISCLOSURE

For the purpose of cracking semiconductor wafers into individual chips or pellets, a surface of the wafer is scribed with a series of V-shaped notches, the wafer is sandwiched between two flexible members, the sandwich is disposed over a cavity, the scribed surface of the wafer facing the cavity, and the flexible members and the wafer therebetween are forced, e.g., pneumatically or mechanically, into the cavity. The flexure of the wafer into a generally concave configuration causes cracking of the wafer along the scribed lines.

BACKGROUND OF THE INVENTION

This invention relates to the fabrication of semiconductor devices, and particularly to the operation of cracking semiconductor wafers into individual pellets or chips.

In the fabrication of semiconductor devices, e.g., integrated circuits, it is the practice to form a plurality of identical device components on a semiconductor wafer and to thereafter dice the wafer to provide individual device pellets or chips. The pellets are thereafter assembled into envelopes to provide individual semiconductor devices.

The device components are usually formed in rows and columns on the wafer, and the wafer dicing operation generally comprises scribing lines on the wafer surface between the rows and columns of components, and cracking the wafer along the scribed lines.

Various means for cracking semiconductor wafers are known. Problems exist, however, with respect to obtaining sharp cracking of the wafer along the scribed lines for preventing damage to the individual pellets, and to preserving the relative orientation of the pellets after cracking for the purpose of facilitating further handling of the individual pellets.

SUMMARY OF THE INVENTION

A scribed semiconductor wafer is mounted between a pair of flexible flat members, and a force is exerted against a face of one of the members for flexing the members and the wafer therebetween, into a generally arched configuration.

In a preferred embodiment, the members comprise rubber membranes which are peripherally clamped over a cavity, and air pressure is used for forcing the membranes and wafer downwardly into the cavity.

The flexure of the wafer causes cracking of the wafer along the scribed lines.

DESCRIPTION OF PREFERRED EMBODIMENTS OF THE INVENTION

Figures 1, 2, 3, 4:
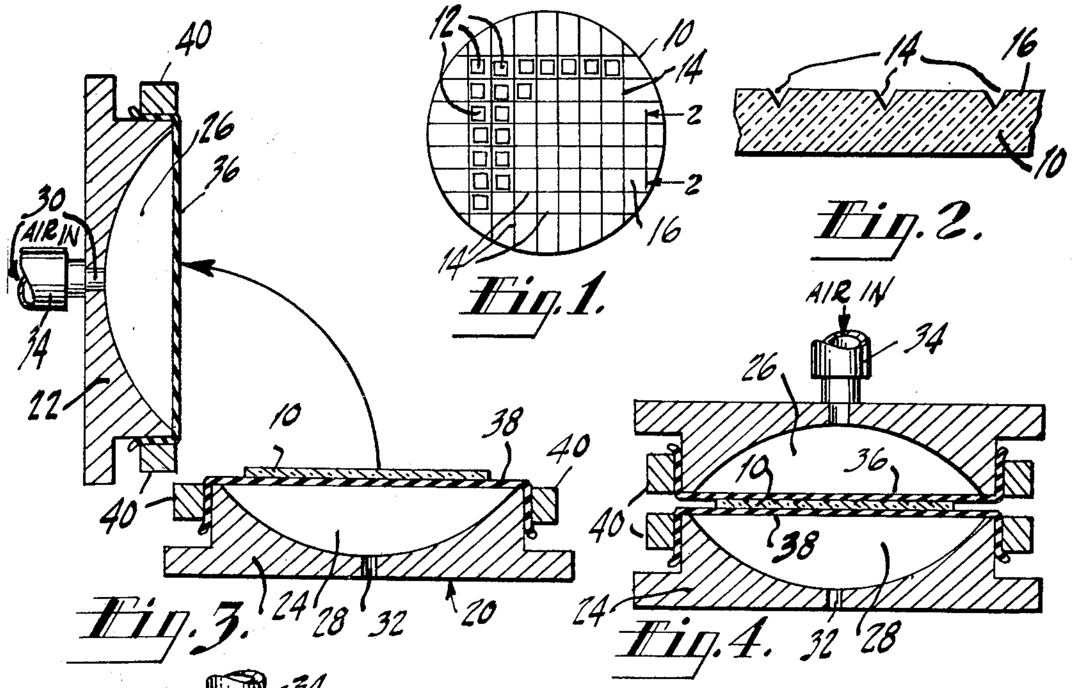
FIG. 1 is a plan view of a semiconductor wafer.
FIG. 2 is a view, in cross section and on an enlarged scale, of a fragment of the wafer shown in FIG. 1.
FIGS. 3–5 are views in cross section illustrating one embodiment of apparatus for practicing the method of the present invention.

With reference to FIG. 1, a semiconductor wafer 10 is shown comprising a thin, circular disc of a semiconductor material, such as silicon. The wafer 10 contains a plurality of identical semiconductor device components 12 arranged in orthogonal rows and columns on the wafer. Various examples of semiconductor device components, and the method of fabrication thereof, are well known.

For the purpose of cracking apart the wafer 10 into individual chips or pellets, a plurality of orthogonal intersecting lines 14 are scribed in one wafer surface 16 between the components 12. Means for scribing the wafer are known. As shown in FIG. 2, the scribed lines 14 have, in cross section, a V-groove shape.

For cracking apart the wafer 10 along the scribed lines 14, an apparatus 20 is provided, as shown in FIG. 3. The apparatus comprises a pair of mating cylindrical blocks 22 and 24, each provided with a spherically arched, shallow concave cavity 26 and 28, respectively, and a passageway 30 and 32 extending through the wall of the blocks 22 and 24, respectively, into communication with the cavities. The passageway 32 of the block 24 is open to the atmosphere, and the passageway 30 of the block 22 is connected to an air line 34 connected to a source of pressurized air, not shown.

Peripherally mounted over each cavity 26 and 28, and in airtight covering relation with the cavities, is a circular membrane or diaphragm 36 and 38, respectively, of a flexible and expandable material such as rubber. The diaphragms 36 and 38 are held tautly in place by a circular ring 40 disposed around each of the blocks 22 and 24. Although not shown, the two blocks 22 and 24 are preferably hinged together at one corner, whereby the blocks can be held in open position, as shown in FIG. 3, or in clamped together relation, as shown in FIG. 4. When the blocks 22 and 24 are in clamped relation, the two diaphragms are disposed one on top of the other in contacting relation.

Figure 5:
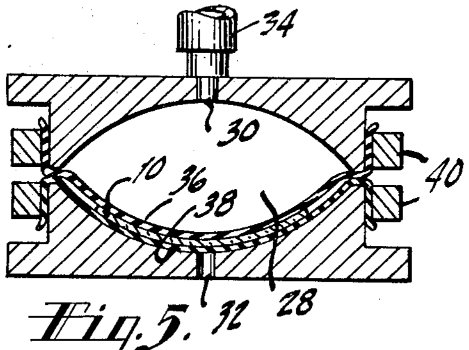

In the use of the apparatus described, a scribed wafer 10 is placed on the diaphragm 38 of the lower block 24, with the scribed surface 16 of the wafer down. The upper block 22 is then clamped onto the lower block 24, the two diaphragms 36 and 38 thus firmly holding the wafer 10 therebetween, as shown in FIG. 4. Pressurized air is then admitted into the upper cavity 26 through the air line 34. This produces a pressure differential between the two cavities and creates a downwardly acting force which deflects the two diaphragms and the wafer therebetween in directions generally transverse to the plane of the wafer. More specifically, the diaphragms 36 and 38 and the wafer 10 are arched downwardly into the lower cavity 28 and into conformity with the spherical concave shape of the cavity 28, as shown in FIG. 5. The air in the lower cavity 28 is expelled through the passageway 32.

The air pressure is then released, allowing the diaphragms and the wafer therebetween to return to their original unflexed position.

This single flexing of the wafer causes cracking of the wafer along the intersecting lines on the wafer surface. This occurs because as the wafer is forced into its flexed, concave (i.e., "arched") configuration, the scribed surface 16 of the wafer, which faces against the lower diaphragm 38, is placed in tension and the unscribed or upper surface of the wafer is placed in compression. This force combination produces a high tensile stress concentration at the apex of the scribed V-notch, whereby the silicon wafer breaks or shears vertically at the apex of the notch.

In one embodiment, the wafer 10 is of silicon, having a thickness of 7 mils and a diameter of 1$\frac{5}{16}$ inch. The wafer contains 32 components, each measuring 180 mils on a side, the components being arranged in 6 columns and 6 rows. The scribed lines 14 have, in cross section, a V-shape, having a depth of 2 mils, and a width of 2 mils at the open end of the notches. The cavities 26 and 28 of the blocks 22 and 24 are segments of a sphere having a radius of 1$\frac{1}{32}$ inch, the cavities having a depth of $\frac{15}{32}$ inch. The diaphragms 36 and 38 are of 16 mils thick rubber. An air pressure of 10–15 p.s.i. is used.

In another embodiment, a wafer having a thin layer of a metal, such as 2.5 mils thick lead, covering the unscribed surface of the wafer, is cracked. In such case, it is found that a single flexing of the wafer is not always sufficient to cause cracking of the metal layer, even though the wafer material itself is cracked along the scribed lines. In such cases, the apparatus shown in FIGS. 3 through 5 is modified to also include an air line 35 (FIG. 6) coupled to a source of air pressure, whereby pressurized air can be admitted into the cavity 28 of the lower block 24.

Figures 6, 9:
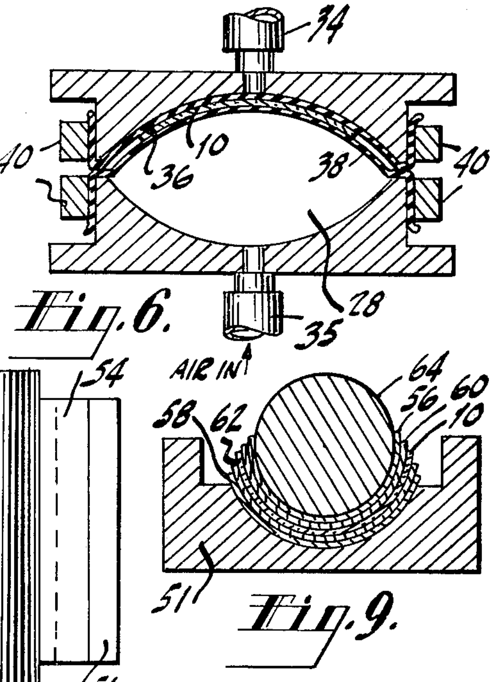
FIG. 6 shows a modification of the apparatus shown in FIGS. 3–5.
FIG. 9 is a view similar to FIG. 7 but at a later step in the practice of the inventive method.

In the use of the apparatus to crack such metal surfaced wafers, pressurized air is first admitted into the cavity 26 of the upper block 22, while the cavity 28 of the lower block 24 is vented to the atmosphere. This causes the two diaphragms 36 and 38 and the wafer 10 to be deflected into the lower cavity 28 (as shown in FIG. 5), thereby cracking the wafer material along the scribed lines 14. The pressure differential across the diaphragms is then reversed by admitting pressurized air into the cavity 28 of the lower block 24 while venting the cavity 26 of the upper block 24. This causes a reverse deflection of the diaphragms and the wafer into the upper cavity 26, as shown in FIG. 6. This reverse flexing of the wafer causes cracking of the metal layer evenly and neatly and exactly opposite to the cracks formed in the wafer along the scribed lines.

During the cracking operation, the two diaphragms maintain the wafer pellets in stationary position with respect to one another. Thus, after the blocks 22 and 24 are unclamped, the separated pellets remain in the same position with respect to one another as they were arranged on the wafer. An advantage of this is that it facilitates further handling of the individual pellets by automatic pickup and transfer mechanisms.

Figure 7:
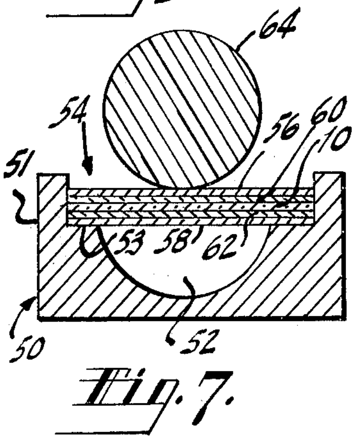
FIG. 7 is a view in cross section showing another embodiment of apparatus for practicing the method of the present invention.
Figure 8:
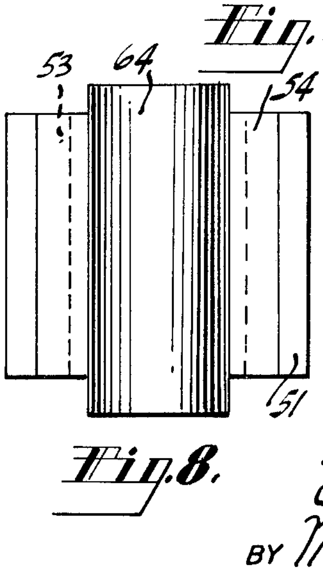
FIG. 8 is a plan view of the apparatus shown in FIG. 7.

With reference to FIG. 7, a further apparatus 50 for practicing the invention is shown. The apparatus comprises a block member 51 having a cylindrically arched cavity 52 therein. An elongated step 53 is provided in the block 51 on each side of the cavity 52 for receipt of a sandwich 54 of materials. The sandwich 54 comprises a pair of thin and flexible sheets of metal 56 and 58, such as 0.005 inch thick spring steel, a scribed wafer 10 to be cracked, and thin sheets 60 and 62 of aluminum foil to hold the pellets in place. A solid cylindrical tool 64 of metal, such as brass, having dimensions slightly smaller than the cavity 52 is also provided.

In the use of the apparatus 50, the sandwich 54 of materials, with the scribed surface 16 of the wafer down, is disposed on the step 53 and over the cylindrical cavity 52. The sandwich 54 is oriented so that one set of parallel scribed lines 14 is generally parallel to the longitudinal axis of the cavity 52.

The tool 64 is placed on top of the sandwich 54, as shown in FIG. 7, and pushed downwardly to flex the sandwich into the cavity 52 and into a cylindrically arched shape, as shown in FIG. 9.

The downward flexure of the sandwich causes cracking of the wafer along the scribed lines parallel to the longitudinal axis of the cylinder. The lines perpendicular to these lines are generally not cracked.

The sandwich is then removed from the block 51, rotated 90° in the plane of the sandwich, and repositioned in the block such that the uncracked lines are parallel to the longitudinal axis of the cylinder. The sandwich is again flexed downwardly into the opening, thereby completing cracking of the scribed lines.

In general, it is found that the first embodiment described, using expandable diaphragms, works most satisfactorily on wafers having pellets measuring more than 100 mils on a side. For smaller pellets, the second embodiment, using flexible, but non-expandable metal sheets, is somewhat more satisfactory.

We claim:

1. The method of cracking a semiconductor wafer comprising:

scribing intersecting lines on a surface of a wafer;

mounting the wafer between a pair of flexible flat members, the scribed surface of said wafer facing one of said members;

exerting a force against the face of the other of said members and towards said one member for flexing said members and said wafer therebetween into a generally arched configuration; and thereafter exerting a force against the face of said one member and towards said other member for reverse flexing said members and wafer into a generally reverse arched configuration.

2. The method of cracking a semiconductor wafer comprising:

scribing intersecting lines on a surface of a wafer;

mounting said wafer between a pair of flexible expandable diaphragms;

disposing said diaphragms in air-tight relation over a cavity; and increasing the ambient pressure on the side of said diaphragms opposite said cavity and forcing said diaphragms and wafer inwardly of said cavity and into a generally arched configuration.

References Cited

UNITED STATES PATENTS

| | | | |
|---|---|---|---|
| 3,040,489 | 6/1962 | Da Costa | 225—2 X |
| 3,182,873 | 5/1965 | Kalvelage | 225—2 |
| 3,396,452 | 8/1968 | Katsuo Sato et al. | 225—2 X |

JAMES M. MEISTER, Primary Examiner

U.S. Cl. X.R.

225—96.5